(12) United States Patent
Yokoi (10) Patent No.: US 6,482,750 B2
(45) Date of Patent: Nov. 19, 2002

(54) METHOD OF MANUFACTURING SEMICONDUCTOR DEVICE INCLUDING A CLEANING STEP, AND SEMICONDUCTOR DEVICE MANUFACTURED THEREBY

(75) Inventor: Naoki Yokoi, Tokyo (JP)

(73) Assignee: Mitsubishi Denki Kabushiki Kaishi, Tokyo (JP)

( * ) Notice: Subject to any disclaimer, the term of this patent is extended or adjusted under 35 U.S.C. 154(b) by 0 days.

(21) Appl. No.: 09/756,872

(22) Filed: Jan. 10, 2001

(65) Prior Publication Data

US 2002/0001962 A1 Jan. 3, 2002

(30) Foreign Application Priority Data

Jun. 30, 2000 (JP) ........................................ 2000-197553

(51) Int. Cl.$^7$ ............................................. H01L 21/302
(52) U.S. Cl. ..................... 438/745; 134/1.3; 510/175; 510/176
(58) Field of Search .................. 438/745, 753–757; 134/1, 1.1, 1.2, 1.3, 175; 514/176, 177, 244, 245

(56) References Cited

U.S. PATENT DOCUMENTS

| | | | | |
|---|---|---|---|---|
| 5,091,103 A | * | 2/1992 | Dean et al. .................. | 252/162 |
| 5,795,702 A | * | 8/1998 | Tanabe et al. ............... | 430/331 |
| 5,798,323 A | * | 8/1998 | Honda et al. ................ | 510/176 |
| 5,817,610 A | * | 10/1998 | Honda et al. ................ | 510/176 |
| 5,911,836 A | * | 6/1999 | Hada et al. .................... | 134/2 |
| 5,972,862 A | * | 10/1999 | Torii et al. .................... | 134/1.2 |
| 5,989,353 A | * | 11/1999 | Skee et al. ..................... | 134/2 |
| 6,140,291 A | * | 10/2000 | Bolkan et al. ............... | 510/245 |
| 6,225,030 B1 | * | 5/2001 | Tanabe et al. ............... | 430/313 |

FOREIGN PATENT DOCUMENTS

| | | | | |
|---|---|---|---|---|
| JP | 9-96911 | 4/1997 | ......... | H01L/21/027 |
| JP | 11-145095 | 5/1999 | ......... | H10L/21/304 |

* cited by examiner

Primary Examiner—Benjamin L. Utech
Assistant Examiner—Duy Deo
(74) Attorney, Agent, or Firm—McDermott, Will & Emery (57) ABSTRACT

In a process of cleaning a semiconductor substrate on which a polysilicon film serving as a silicon-based member and a tungsten film serving as a tungsten-based member are exposed simultaneously, there is used a cleaning fluid containing a hydroxide, a water-soluble organic solvent, a compound expressed by the following chemical formula (I) or (II) which is to serve as a silicon corrosion inhibitor, an organic compound, and at least one organic compound which is to serve as a tungsten corrosion inhibitor.

HO-{(EO)x-(PO)y}z-H            (I)

R-[{(EO)x-(PO)y}z-H]m           (II)

19 Claims, 4 Drawing Sheets

METHOD OF MANUFACTURING SEMICONDUCTOR DEVICE INCLUDING A CLEANING STEP, AND SEMICONDUCTOR DEVICE MANUFACTURED THEREBY

BACKGROUND OF THE INVENTION

1. Field of the Invention

The present invention relates to a method of manufacturing a semiconductor device and to a semiconductor device manufactured thereby, and more particularly, to a cleaning process of a semiconductor substrate.

2. Description of the Background Art

Adsorption and elimination of particles onto and from the surface of a semiconductor substrate are usually explained by an electrostatic phenomenon. When the surface of the semiconductor substrate and the surfaces of particles are charged with the same polarity, particles leave from the surface of the semiconductor substrate by electrostatic repulsion. In an alkaline cleaning fluid, the surface of the semiconductor substrate and the surfaces of particles are charged with the same polarity.

Accordingly, in the course of manufacture of a semiconductor device, an alkaline cleaning fluid; for example aqueous ammonium hydroxide or a mixed hydrogen peroxide liquid (hereinafter called "APM"), has been widely used for a process of cleaning a semiconductor substrate.

Tungsten used as material of a wire has the property of reacting vigorously with an oxidizing agent such as hydrogen peroxide until dissolution. For this reason, a semiconductor substrate having tungsten exposed thereon cannot be cleaned by use of APM.

A solution of hydroxide has been used as a cleaning fluid in the process of cleaning a semiconductor substrate having tungsten or an alloy thereof (hereinafter called "tungsten-based members") exposed thereon.

Here, the hydroxides include ammonium hydroxide, sodium hydroxide, potassium hydroxide, and tetramethylammonium hydroxide (hereinafter called "TMAH"). From the viewpoint of protection of a semiconductor substrate from metal contamination, use of ammonium hydroxide or TMAH, which does not contain any metal atoms, is preferable in cleaning the semiconductor substrate.

Since a solution of ammonium hydroxide (hereinafter called "aqueous ammonium") has the property of dissolving silicon, aqueous ammonium cannot be used for cleaning a semiconductor substrate having exposed thereon a silicon-based member such as polycrystalline silicon (hereinafter called "polysilicon"), amorphous silicon, a silicon oxide film, or a silicon substrate.

For these reasons, the alkaline cleaning fluid cannot be used for cleaning a semiconductor substrate having both a tungsten-based member and a silicon-based member exposed thereon.

In order to clean the semiconductor substrate having exposed the tungsten-based member and exposed the silicon-based member, a compound expressed by the following chemical formula (I) or (II), which is served as a silicon corrosion inhibitor, is added to the cleaning fluid containing an aqueous hydroxide, or an aqueous ammonium, for example.

wherein "EO" designates an oxyethyethylene group, and "PO" designates an oxypropylene group. "R" designates a residue formed by eliminating hydrogen atoms from a hydroxyl group of alcohol or amine, or a residue formed by eliminating hydrogen atoms from an amino acid. "x" and "y" are integers satisfying $x/(x+y)=0.05$ to $0.4$, and "z" and "m" are positive integers.

Next, a conventional method of manufacturing a semiconductor device using the foregoing cleaning fluid will be described.

Figure 1A:
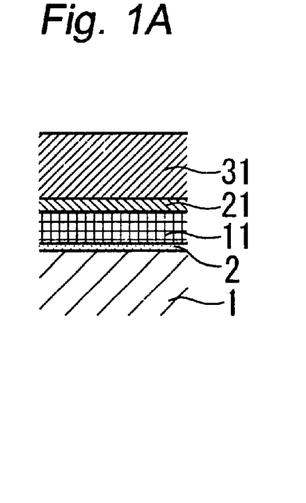
Figure 1B:
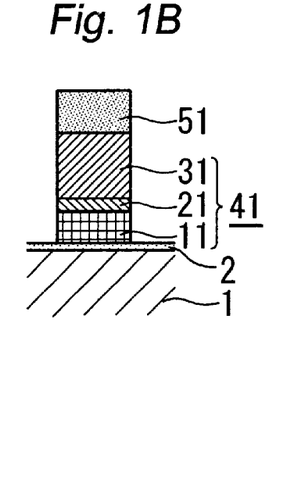
Figure 1C:
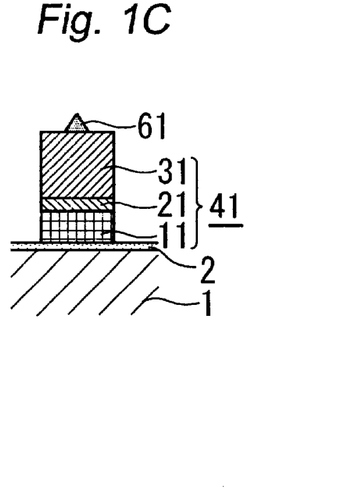

With reference to FIGS. 1A to 1C, a first conventional method of manufacturing a semiconductor device will be described. More specifically, a method of forming a gate electrode of a MOS transistor will be described.

As shown in FIG. 1A, a gate insulating film 2, a polysilicon film 11, a barrier metal layer 21, and a tungsten film 31 are formed on a semiconductor substrate 1, in the sequence.

Next, as shown in FIG. 1B, a resist pattern 51 is formed on the tungsten film 31, and an interconnection pattern (gate electrode) 41 is formed by dry etching with the resist pattern 51 as a mask.

Next, as shown in FIG. 1C, the resist pattern 51 is removed by plasma ashing (ashing), thereafter resist residues 61 are remained on the top of the gate electrode 41. Although not shown, the resist residues 61 are remained on the both sides of the gate electrode 41.

Finally, the semiconductor substrate is cleaned in a subsequent cleaning step, in which the semiconductor substrate 1 is cleaned by use of the previously-described cleaning fluid. Thus, the resist residues 61 are removed from the semiconductor substrate 1, and a semiconductor device is manufactured.

Figure 2A:
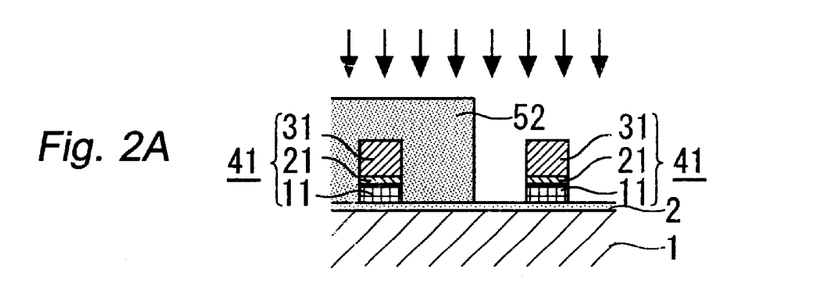
Figure 2B:
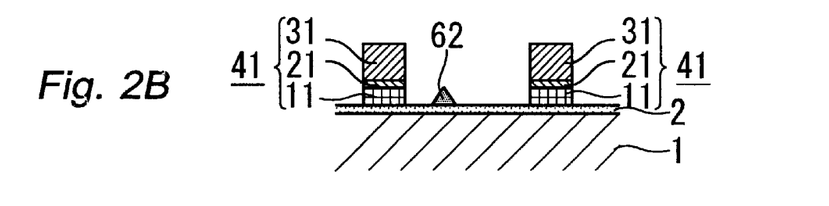
Figure 2C:
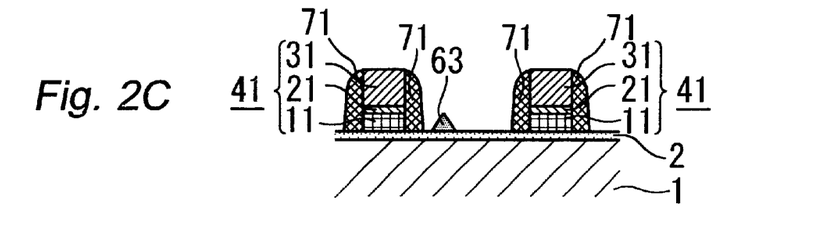

With reference to FIGS. 2A to 2C, a second conventional method of manufacturing a semiconductor device will be described. More specifically, a method of forming a source region and a drain region of a MOS transistor will be described.

With reference to FIG. 2A, the interconnection pattern (gate electrode) 41 is formed on the gate insulating film 2 formed on the semiconductor substrate 1, by the same method as that illustrated in FIGS. 1A to 1C.

Further, a resist pattern 52 is formed on the gate electrode 41 and on the gate insulating film 2 around the gate electrode 41.

Next, ions are implanted into the semiconductor substrate 1 (as indicated by arrows shown in FIG. 2A) with the resist pattern 52 as a mask. Thus, although not shown, a source region or a drain region of a MOS transistor is formed in the semiconductor substrate 1.

Subsequently, although not shown, the resist pattern 52 is removed by plasma ashing, thereafter resist residues 62 are remained on the gate insulating film 2 on the semiconductor substrate 1, as shown in FIG. 2B.

Finally, although not shown, the semiconductor substrate 1 is cleaned in cleaning step, more specifically, in which the semiconductor substrate 1 is cleaned by use of the previously-described cleaning fluid. Thus, the resist residues 62 are removed from the semiconductor substrate 1, and the semiconductor device is manufactured.

As shown in FIG. 2C, there may be a case in which, after side walls 71 have been formed on the both sides of the gate electrode 41, ions are implanted into the semiconductor substrate 1. Even in such a case, a silicon-based member or a tungsten-based member may become partially exposed through pin holes formed in the side walls 71. For this reason, the semiconductor substrate 1 is cleaned by use of the previously-described cleaning fluid, to thereby remove the resist residues 63.

In the cleaning step of the conventional methods, however, there are problems as follows.

In a case where the cleaning fluid has a high hydroxide content, the silicon inhibitor cannot be added to the cleaning fluid at high concentration. The reason for this is that, if both the silicon corrosion inhibitor and hydroxide are added to the cleaning fluid at high concentrations, the cleaning capability of the cleaning fluid is resultant degraded.

More specifically, in the cleaning step of the semiconductor substrate having a silicon-based member and a tungsten-based member exposed thereon, use of the cleaning fluid cannot be attained both a high cleaning capability and a high silicon corrosion prevention effect simultaneously.

In order to remove particles from the semiconductor substrate 1, the previously-described cleaning step is often carried out several times.

Further, in a case where plural transistors having different electrical properties are formed on the semiconductor substrate 1, the steps illustrated in FIGS. 2A to 2C (i.e., the step of forming a resist pattern, the step of implanting ions, the step of removing a resist pattern, and a cleaning step) must be carried out several times.

Here, a hydroxide, which is contained in the cleaning fluid, has the property of eluting tungsten slightly.

Therefore, in the case that the semiconductor substrate 1 must be cleaned several times as mentioned above, an amount, to which the tungsten film 31 is eluted by use of the previously-described cleaning fluid, exceeds an allowable range. As a result, which may cause formation of the interconnection pattern 41 having an abnormal shape, or deterioration of electrical characteristic of a transistor.

SUMMARY OF THE INVENTION

The present invention has been conceived to solve the previously-mentioned problems and a general object of the present invention is to provide a novel and useful method of manufacturing a semiconductor device, and semiconductor device.

A more specific object of the present invention is to attain a high cleaning capability and a high silicon corrosion prevention effect simultaneously in a cleaning step of a semiconductor substrate having tungsten and silicon exposed thereon.

A more specific another object of the present invention is to attain a high tungsten corrosion prevention effect in a cleaning step of the method of manufacturing a semiconductor device.

The above object of the present invention is attained by a following method of manufacturing a semiconductor device.

According to one aspect of the present invention, in a method of manufacturing a semiconductor device, a semiconductor substrate is cleaned by use of a cleaning fluid containing a hydroxide, a water-soluble organic solvent, and a compound expressed by the following chemical formula (I) or (II), in a cleaning step.

(I)

(II)

wherein "EO" designates an oxyethyethylene group; "PO" designates an oxypropylene group; "R" designates a residue formed by eliminating hydrogen atoms from a hydroxyl group of alcohol or amine, or a residue formed by eliminating hydrogen atoms from an amino acid; "x" and "y" are integers satisfying x/(x+y)=0.05 to 0.4; and "z" and "m" are positive integers.

In the method of manufacturing a semiconductor device, the cleaning fluid containing the water-soluble organic solvent which increase a concentration of a hydroxide, the compound which is expressed by the chemical formula (I) or (II) and is served as a silicon corrosion inhibitor, is used in the cleaning step. Therefore, a high cleaning capability and a high silicon corrosion prevention effect is attained simultaneously in the cleaning step.

According to another aspect of the present invention, in a manufacturing method of a semiconductor device, a semiconductor substrate is cleaned by use of a cleaning fluid containing a hydroxide, and at least one organic compound selected from the group of the an organic compound having at least one mercapto group, an organic compound having at least two hydroxyl groups, and an organic compound having at least one hydroxyl group and at least one carboxyl group, in a cleaning step.

In the method of manufacturing a semiconductor device, the cleaning fluid containing the organic compound, which is served as a tungsten corrosion inhibitor, is used in the cleaning step. Therefore, a high tungsten corrosion prevention effect is attained in the cleaning step.

Other objects and further features of the present invention will be apparent from the following detailed description when read in conjunction with the accompanying drawings.

BRIEF DESCRIPTION OF THE DRAWINGS

FIGS. 1A to 2C are cross-sectional view for describing a method of manufacturing a semiconductor device, according to a first embodiment of the present invention;

DETAILED DESCRIPTION OF THE PREFERRED EMBODIMENTS

In the following, principles and embodiments of the present invention will be described with reference to the accompanying drawings. The members and steps that are common to some of the drawings are given the same reference numerals and redundant descriptions therefore may be omitted.

First Embodiment

FIGS. 1A to 2C are cross-sectional views for describing a method of manufacturing a semiconductor device according to a first embodiment of the present invention. More specifically, FIGS. 1A to 1C show a method of forming a gate electrode of a MOS transistor, and FIGS. 2A to 2C show a method of forming a source region and a drain region of the MOS transistor.

With reference to FIGS. 1A to 1C, a first method of manufacturing a semiconductor device according to the first embodiment will now be described.

As shown in FIG. 1A, a gate insulating film serving as an insulating film 2, a polycrystalline silicon film 11 (hereinafter called "polysilicon film"), a barrier metal film 21 composed of a tungsten nitride film, for example, and a tungsten film 31 are formed on the semiconductor substrate 1, in this sequence, by thermal oxidation, chemical vapor deposition (CVD) method, or physical vapor deposition (PVD) method.

Next, with reference to FIG. 1B, a resist pattern 51 is formed on the tungsten film 31, and a gate electrode serving as an interconnection pattern 41 is formed by dry etching with the resist pattern 51 as a mask.

Subsequently, the resist pattern 51 is removed by plasma ashing, thereafter resist residues 61 are remained on the top of the interconnection pattern 41, as shown in FIG. 1C. Although not shown, the resist residues 61 are remained also on the both sides of the interconnection pattern 41.

Finally, although not shown, the semiconductor substrate 1 is cleaned in a cleaning step, more specifically, in which the semiconductor substrate 1 is cleaned by use of a cleaning fluid (which will be described in detail later) containing a hydroxide, a water-soluble organic solvent, and a compound expressed by either a following chemical formula (I) or (II) (hereinafter called "a silicon corrosion inhibitor" in subsequent embodiments).

HO-{(EO)x-(PO)y}z-H  (I)

R-[{(EO)x-(PO)y}z-H]m  (II)

Thus, the resist residues 61 and un-illustrated particles are removed from the semiconductor substrate 1.

Next, with reference to FIGS. 2A to 2C, a second method of manufacturing a semiconductor device according to the first embodiment will now be described.

With reference to FIG. 2A, a gate electrode serving as the interconnection pattern 41 is formed on the insulating film 2 formed on the semiconductor substrate 1, by the same method as that illustrated in FIGS. 1A to 1C.

Next, a resist pattern 52 is formed on the interconnection pattern 41 and on the insulating film 2 around the interconnection pattern 41.

Subsequently, ions are implanted into the semiconductor substrate 1 (as indicated by arrows shown in FIG. 2A) with the resist pattern 52 as a mask. Thus, although not shown, a source region or a drain region of a MOS transistor is formed in the semiconductor substrate 1.

Next, as shown in FIG. 2B, the resist pattern 52 is removed by plasma ashing, thereafter the resist residues 62 are remained on the insulating film 2.

Finally, the semiconductor substrate 1 is cleaned in a cleaning step, as in the case shown in FIGS. 1A to 1C, thereby the resist residues 62 or particles (not shown) are removed from the semiconductor substrate 1. Here, in the cleaning step, a cleaning fluid (which will be described in detail later) containing hydroxide, a water-soluble organic solvent, and a silicon corrosion inhibitor is used.

The cleaning fluid used in the cleaning step of the method of manufacturing a semiconductor device will now be described in detail.

Hydroxide, which is contained in the cleaning fluid, is at least one member selected from the group of ammonium hydroxide, TMAH (tetramethylammonium hydroxide), sodium hydroxide, and potassium hydroxide. From the viewpoint of protection of the semiconductor substrate 1 from metal contamination, ammonium hydroxide or TMAH is preferable as hydroxide to be contained in the cleaning fluid. Further, from the viewpoint of protecting a tungsten-based member from corrosion, ammonium hydroxide is more preferable.

In connection with the compound (i.e., a silicon corrosion inhibitor) expressed by chemical formula (I) or (II), "EO" designates an oxyethethylene group expressed by "—CH2—CH2—O—", and "PO" designates an oxypropylene group expressed by "—CH(CH3)—CH2—O—" or "—CH2—CH(CH3)—O—". Here, the mean molecular weight of the oxypropylene group [a substance expressed by "(PO)y"] is 500 to 5000. "R" designates a residue formed by eliminating hydrogen atoms from a hydroxyl group of alcohol or amine, or a residue formed by eliminating hydrogen atoms from an amino acid. Specific examples of alcohols and amines constituting R include 2-ethylhexyl alcohol, lauryl alcohol, cetyl alcohol, oleyl alcohol, tridecyl alcohol, beef tallow alcohol, coconut oil alcohol, ethylene glycol, propylene glycol, 1,3-propanediol, 1,2-butanediol, 2,3-butanediol, 1,4-butanediol, 2-methyl-1,3-propanediol, glycerine, trimethylolethane, trimethylolpropane, pentaerythritol, sorbitol, ethylenediamine, and propylenediamine. "x" and "y" are integers satisfying x/(x+y)=0.05 to 0.4, and "z" and "m" are positive integers.

A water-soluble organic solvent, which is contained in the cleaning fluid, is at least one member selected from the group of alcohols, ketones, esters, and phenols. Specific examples of alcohols include methanol, ethanol, 1-propanol, 2-propanol, 1-butanol, 2-butanol, isobutyl alcohol, tert-butyl alcohol, and ethylene glycol. Specific examples of ketones include acetone, methyl ethyl ketone, 2-pentanone, and 3-pentanone. Specific examples of esters include methyl formate, ethyl formate, propyl formate, methyl acetate, ethyl acetate, and triethyl phosphate. Specific examples of phenols include phenol, o-cresol, p-cresol, and m-cresol.

The cleaning fluid has the following specific composition: namely, the hydroxide has a concentration of 0.3 wt. %; the silicon corrosion inhibitor (the compound expressed by chemical formula (I) or (II)) has a concentration of 5 to 50 ppm; the water-soluble organic solvent has a concentration of 10 to 40 wt. %; and an organic compound (which will be described later) has a concentration of 5 to 2000 ppm.

The hydroxide and the silicon corrosion inhibitor were mixed into the cleaning fluid in proportions (by weight) of about 1: $(0.3 \times 10^{-4}$ to 1).

The superior cleaning capability of the cleaning fluid was checked by changing the concentration of hydroxide within the range of 0.01 wt. % to 31 wt. %.

Further, the superior cleaning capability of the cleaning fluid was checked by changing the concentration of water-soluble organic solvent within the range of 0.01 wt. % to 50 wt. %.

More further, the superior cleaning capability of the cleaning fluid was also checked by changing the concentration of organic compound within the range of 0.0001 wt. % to 5 wt. %.

The cleaning fluid is an alkaline solution having a pH of 8 or more, and a temperature of the cleaning fluid is 40 to 50° C. (which will be described later).

Next, a cleaning equipment, which is used in the previously-described cleaning step, will be described.

The previously-described cleaning step is performed in any one of batch and immersion (bath type) cleaning equipment, batch and spray cleaning equipment, and a single-wafer cleaning equipment, although not shown.

An ultrasonic cleaning device is installed in the cleaning equipment, for example, batch and immersion cleaning equipment or the single-wafer cleaning equipment. As a result of ultrasonic cleaning the semiconductor substrate in the batch and immersion cleaning equipment or the single-wafer cleaning equipment with the ultrasonic cleaning device, an improvement in cleaning capability was acknowledged.

Here, although not shown, in the single-wafer cleaning equipment, a vibratory device is installed on an injection nozzle for spraying the cleaning fluid to the semiconductor substrate. The ultrasonic waves generating from the vibratory device propagate through the cleaning fluid to the semiconductor substrate.

The superior cleaning capability of the cleaning fluid was acknowledged by varying the temperature of the cleaning fluid within the range of 20 to 80° C. in each of the cleaning equipments. Here, the optimal temperature of the cleaning fluid was found to be 40 to 50° C.

The composition of the cleaning fluid used in the cleaning equipment changes with use. For this reason, in the batch and immersion (bath type) cleaning equipment, at least one of plural components of the cleaning fluid is successively added to a bath in order to maintain a constant composition of the cleaning fluid. In the batch and spray cleaning equipment and the single-wafer cleaning equipment, at least one type of component is successively added to a storage tank for circulating and recycling the cleaning fluid.

In contrast, the cleaning fluid used for cleaning operations may be discarded every time a cleaning step is finished. As a result, contaminants removed from the semiconductor substrate, which has been cleaned immediately before, will not adhere to the semiconductor substrate which is currently being cleaned. Further, concentrations of components of the cleaning fluid can be maintained constant concentrations. Cleaning cost in this case is the same as that in a case where required compositions are successfully added to the cleaning fluid, because the concentration of the cleaning fluid is made low.

The descriptions in relation to the cleaning fluid and the cleaning equipment are also applied to other embodiments, which will be described later.

As described above, in the method of manufacturing a semiconductor device according to the first embodiment, the semiconductor substrate 1 is cleaned in the cleaning step subsequent to formation of the interconnection pattern 41 by dry etching or subsequent to implantation of ions into the semiconductor substrate 1 performed after formation of the interconnection pattern 41.

In the cleaning step, the cleaning fluid containing the hydroxide, the wafer-soluble organic solvent, and the silicon corrosion inhibitor (the compound expressed by the chemical formula(I) or (II)), is used.

According to the method, even when the silicon corrosion inhibitor is added to the cleaning fluid at high concentration, the water-soluble organic solvent, which is added to the cleaning fluid, enables an increase in the concentration of hydroxide in the cleaning fluid.

Therefore, high cleaning capability and a high silicon corrosion prevention effect can be attained simultaneously. Here, the expression "cleaning capability" signifies the property of removing resist residues or particles (the same applies to the following descriptions).

In the cleaning step, adding the organic compound, which is served as a tungsten corrosion inhibitor, to the cleaning fluid, can prevent corrosion of a tungsten film 31.

Here, the expression "organic compound" means at least one member selected from the group of an organic compound having at least one mercapto group, an organic compound having at least two hydroxyl groups, and an organic compound having at least one hydroxyl group and at least one carboxyl group.

Therefore, in the course of the cleaning step, corrosion of the polysilicon film 11 (i.e., a silicon-based member) and corrosion of the tungsten film 31 (i.e., a tungsten-based member) can be prevented simultaneously.

Further, variations in the dimension of the interconnection pattern (gate electrode) 41, which arise during the cleaning step, can be diminished. Thus, deterioration of electrical characteristic of a transistor can be prevented.

In a case where the side walls 71 are formed on the both sides of the interconnection pattern 41 as shown in FIG. 2C, the previously-described cleaning fluid containing the hydroxide, the water-soluble organic solvent, and the organic compound is used in the cleaning step. Thus, the resist residues 63 are removed from the semiconductor substrate 1.

Further, even if pin holes are formed in the side walls 71 and where the tungsten film 31 and the polysilicon film 11 become partially exposed, corrosion of a silicon member and a tungsten member during the cleaning step can be prevented.

In the first embodiment a photoresist pattern is used as a mask. However, even when an insulating film, such as a silicon oxide film or a silicon nitride film, is used as a mask, the cleaning fluid can be used in the cleaning step subsequent to a step of dry etching the semiconductor substrate while the insulation mask is used as a mask.

Second Embodiment

Figure 3A:
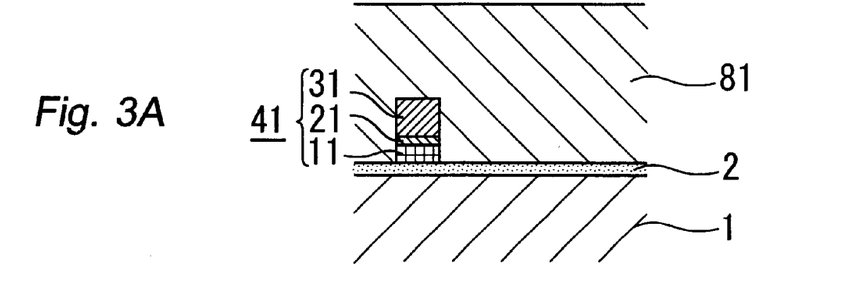
FIGS. 3A to 3C are cross-sectional views for describing a method of manufacturing a semiconductor device, according to a second embodiment of the present invention.
Figure 3B:
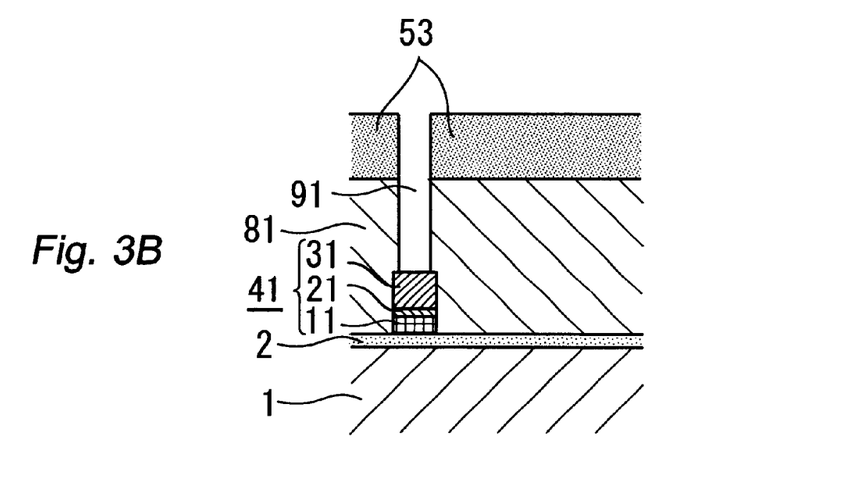
Figure 3C:
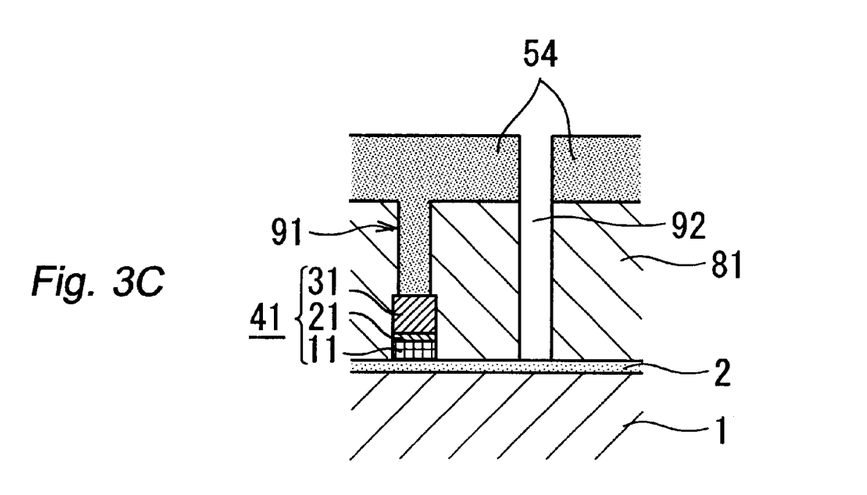

FIGS. 3A to 3C are cross-sectional views for describing a method of manufacturing a semiconductor device according to a second embodiment of the present invention.

With reference to FIGS. 3A to 3C, the method of manufacturing a semiconductor device according to the second embodiment will now be described. Components of a cleaning fluid used in the second embodiment are identical with those described in the first embodiment. Hence, repetition of their explanations is omitted here.

In the same manner as in the method described in connection with the first embodiment by reference to FIGS. 1A to 1C, a gate insulating film serving as an insulating film 2 (hereinafter called "a first insulating film") is formed on the semiconductor substrate 1. Next, the interconnection pattern 41 is formed by stacking the polysilicon film 11, the barrier metal layer 21, and the tungsten film 31 on the first insulating film 2.

Next, an interlayer insulating film serving as a second insulating film 81 composed of a silicon oxide film, for example, is formed on the interconnection pattern 41 and on the first insulating film 2 by the CVD method.

Subsequently, as shown in FIG. 3B, a first resist pattern 53 is formed on the second insulating film 81. Next, a first contact hole 91 is formed by dry etching so as to extend from the surface of the second insulating film 81 to the interconnection pattern 41 (i.e., the tungsten film 31 which is the top layer of the interconnection pattern 41), with the first resist pattern 53 as a mask,.

Next, although not shown, the first resist pattern 53 is removed by plasma ashing, thereafter resist residues are remained on the second insulating film 81 and on the internal surface of the first contact hole 91.

Subsequently, although not shown, the semiconductor substrate 1 is cleaned in a first cleaning step by use of a first cleaning fluid (which will be described in detail later) containing a hydroxide and an organic compound. Thus, resist residues and particles are removed from the semiconductor substrate 1.

Next, a second resist pattern 54 is formed on the internal surface of the first contact hole 91 and on the second insulating film 81.

Next, a second contact hole 92 is formed by dry etching so as to extend from the surface of the second insulating film 81 to the first insulating film 2, with the second resist pattern 54 as a mask.

Subsequently, although not shown, the second resist pattern 54 is removed by plasma ashing, thereafter resist residues are remained on the second insulating film 81 and on the internal surface of the first contact hole 91.

Finally, although not shown, the semiconductor substrate 1 is cleaned in a second cleaning step, more specifically, in which the semiconductor substrate 1 is cleaned by use a second cleaning fluid containing a hydroxide, a silicon corrosion inhibitor, and an organic compound. Thus, the resist residues and particles are removed from the semiconductor substrate 1.

As described above, in the method of manufacturing a semiconductor device according to the second embodiment of the present invention, the semiconductor substrate 1 is cleaned in the first cleaning step subsequent to formation of the insulating film 81 on the interconnection pattern 41 and formation of the first contact hole 91 so as to extend from the surface of the insulating film 81 to the top of the interconnection pattern 41. Here, in the first cleaning step, a first cleaning fluid containing the hydroxide and the organic compound serving as the tungsten corrosion inhibitor is used.

Accordingly, in the first cleaning step, the organic compound, which is contained in the first cleaning fluid, prevents corrosion of the tungsten film 31 serving as a tungsten-based member exposed on the bottom of the contact hole 91.

Further addition of a silicon corrosion inhibitor to the first cleaning fluid can prevent corrosion of the insulating film 81 serving as a silicon-based members exposed on the internal surface (both sides) of the contact hole 91.

Further, even when the silicon corrosion inhibitor is added to the first cleaning fluid at high concentration, the water-soluble organic solvent, which is added to the first cleaning fluid, enables an increase in the concentration of hydroxide in the first cleaning fluid. Accordingly, a high cleaning capability and a high silicon corrosion prevention effect can be attained simultaneously.

Here, only a high cleaning capability can be attained in the first cleaning step by adding only the water-soluble organic solvent to the first cleaning fluid.

After the first cleaning step, the semiconductor substrate 1 is cleaned in the second cleaning step subsequent to formation of the second contact hole 92, which is formed so as to extend from the surface of the insulating film 82 to the insulating film 2. In the second cleaning step, the second cleaning fluid containing the hydroxide, the silicon corrosion inhibitor, and the water-soluble organic solvent is used.

Therefore, in the second cleaning step, corrosion of the second insulating film 2, which is served as a silicon-based member exposed on the bottom of the second contact hole 92, can be prevented.

Even when a silicon corrosion inhibitor is added to the second cleaning fluid at high concentration the water-soluble organic solvent, which is added to the cleaning fluid, enables an increase in the concentration of hydroxide in the cleaning fluid.

Therefore, a high cleaning capability and a high silicon corrosion prevention effect can be attained simultaneously in the second cleaning step.

In addition to the foregoing advantages, corrosion of the tungsten film 31, which is served as a tungsten-based member exposed on the bottom of the contact hole 91, can be prevented by further addition of an organic compound serving as a tungsten corrosion inhibitor to the second cleaning fluid.

Therefore, a high cleaning capability, a high silicon corrosion prevention effect, and a high tungsten corrosion prevention effect can be attained simultaneously in the second cleaning step.

The first and second contact holes 91 and 92 may be formed simultaneously as follows.

With reference to FIG. 3A, the second insulating film 81 is formed on the interconnection pattern 41 and on the first insulating film 2 around the interconnection pattern 41. Next, although not shown, a resist pattern for forming the first and second contact holes 91 and 92 is formed in the second insulating film 81.

Next, the first contact hole 91 so as to extend from the surface of the second insulating film 81 to the top of the interconnection pattern 41, and the second contact hole 92 so as to extend from the surface of the second insulating film 81 to the first insulating film 2, are formed by dry etching simultaneously, with the resist pattern as a mask.

Subsequently, the resist pattern (not shown) is removed by plasma ashing, and the semiconductor substrate 1 is cleaned by use of the second cleaning fluid.

In this case, the same cleaning capability as that attained, when the semiconductor substrate 1 is cleaned in the first and second cleaning step, can be attained. More specifically, resist residues and particles are removed to the same extent as attained when the semiconductor substrate 1 is cleaned in the first step and second cleaning step.

Further, the number of times a semiconductor substrate is cleaned can be reduced to one time, thereby diminishing cost of manufacturing of a semiconductor device.

Even when an un-illustrated third contact hole is formed in the second insulating film 81, the semiconductor substrate 1 may be cleaned by use of the foregoing cleaning fluids. At this time, any members other than a silicon-based member or a tungsten-based member may be exposed on the bottom of the third contact hole.

Third Embodiment

Figure 4A:
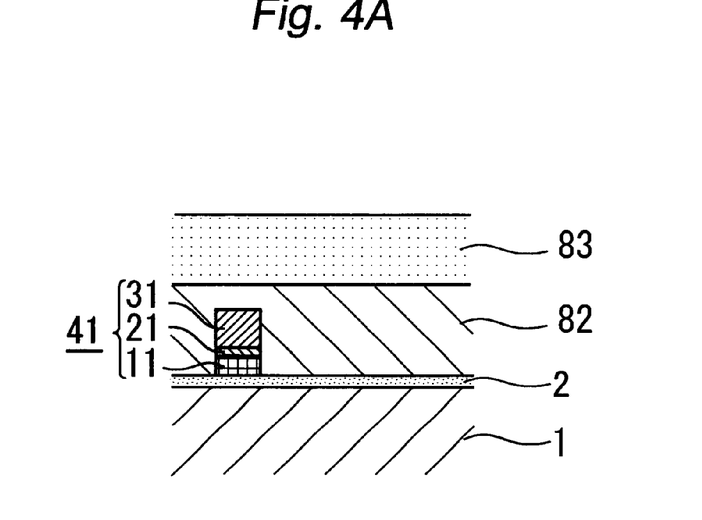
FIGS. 4A and 4B are cross-sectional views for describing a method of manufacturing a semiconductor device, according to a third embodiment of the present invention.
Figure 4B:
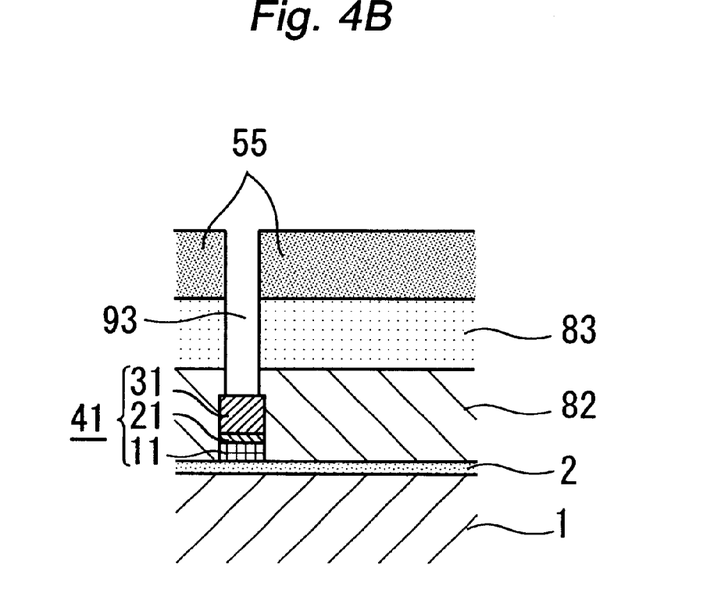

FIGS. 4A and 4B are cross-sectional views for describing a method of manufacturing a semiconductor device according to a third embodiment of the present invention.

With reference to FIGS. 4A and 4B, the method of manufacturing a semiconductor device according to the third embodiment will now be described. Components of a cleaning fluid used in the present embodiment are identical with those described in the first embodiment. Hence, repetition of their explanations is omitted here.

As shown in FIG. 4A, an insulating film 2 (hereinafter called "a first insulating film") composed of a silicon oxide film, for example, is formed on the semiconductor substrate 1 by CVD method. Next, an interconnection pattern 41 serving as a gate electrode is formed by stacking a polysilicon film 11, a barrier metal layer 21 composed of titanium nitride, for example, and a tungsten film 31 on the first insulating film 2.

Next, an interlayer insulating film serving as a second insulating film 82 composed of a silicon oxide film, for example, is formed on the interconnection pattern 41 and on the first insulating film 2 around the interconnection pattern 41 by the CVD method.

Further, an interlayer insulating film serving as a third insulating film 83 composed of a silicon oxide film, for example, is formed on the second insulating film 82, by CVD method.

Here, the insulating film 82 differs in type from the insulating film 83. For instance, either the insulating film 82 or 83 is a silicon oxide film doped with boron or phosphorous, and the remaining one is a non-doped silicon oxide film.

Next, as shown in FIG. 4B, a resist pattern 55 is formed on the third insulating film 83. Subsequently, a contact hole 93 is formed by dry etching so as to extend from the surface of the third insulating film 83 to the top of the interconnection pattern 41, with the resist pattern 55 as a mask, Next, the resist pattern 55 is removed by plasma ashing, thereafter un-illustrated resist residues are remained on the third insulating film 83 and on the internal surface of the contact hole 93.

Subsequently, although not shown, the semiconductor substrate 1 is cleaned in a cleaning step, more specically, in which the semiconductor substrate 1 is cleaned by use of a cleaning fluid containing a hydroxide, a silicon corrosion inhibitor, and a water-soluble organic solvent. Thus, although not shown, the resist residues and particles are removed from the semiconductor substrate 1.

As described above, in the method of manufacturing a semiconductor device according to the third embodiment of the present invention, the semiconductor substrate 1 is cleaned in the cleaning step subsequent to formation of the two types of insulating films 82 and 83 on the interconnection pattern 41, and formation of the contact hole 93 so as to extend from the surface of the third insulating film 83 to the interconnection pattern 41. In the cleaning step, the cleaning fluid containing the hydroxide, the silicon corrosion inhibitor, and the water-soluble organic solvent, is used.

According to this method, adding the silicon corrosion inhibitor to the cleaning fluid prevents corrosion of two types of insulating films 82 and 83 during the cleaning step.

Therefore, a step, which arises in a boundary area between the two types of insulating films 82 and 83 of the internal surface of the contact hole 93, can be minimized without a change in the diameter of the contact hole 93.

As a result, although not shown, metal can be easily embedded into the contact hole 93 after the cleaning step.

Since the hydroxide content increases by a water-soluble organic solvent added to the cleaning fluid, the cleaning capability of a cleaning fluid and the ability to remove resist residues and particles are improved.

Even when a silicon corrosion inhibitor is added to a cleaning fluid at high concentration, the water-soluble organic solvent, which is added to the cleaning fluid, enables an increase in the concentration of hydroxide in the cleaning fluid. Namely, the hydroxide content of the cleaning fluid can be increased by adding the water-soluble organic solvent. Therefore, a high cleaning capability and a high silicon corrosion prevention effect can be attained simultaneously in the cleaning step.

In addition to the foregoing advantages, corrosion of the tungsten film 31 serving as a tungsten-based member exposed on the bottom of the contact hole 93 can be prevented by further addition of a tungsten corrosion inhibitor (the previously-mentioned organic compound) to the cleaning fluid containing the hydroxide, the silicon corrosion inhibitor, and the water-soluble organic solvent.

Fourth Embodiment

Figure 5A:
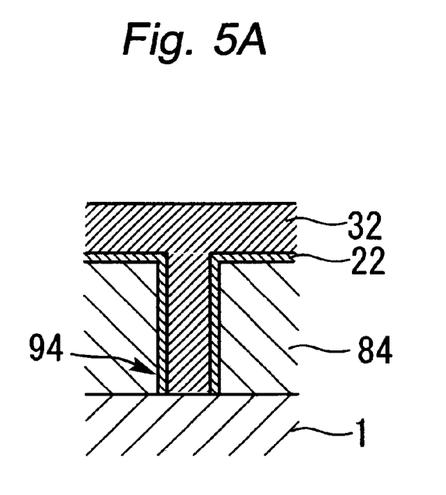
FIGS. 5A and 5B are cross-sectional views for describing a method of manufacturing a semiconductor device, according to a fourth embodiment of the present invention.
Figure 5B:
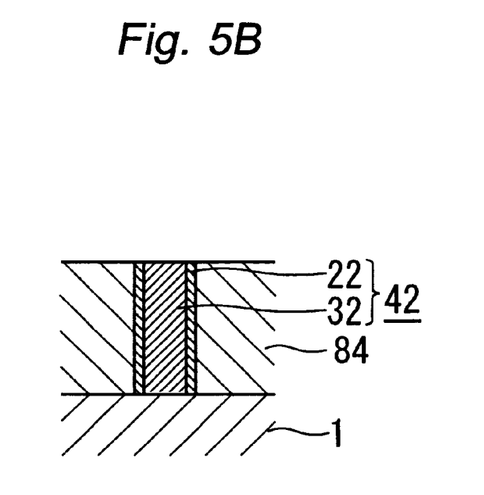

FIGS. 5A and 5B are cross-sectional views for describing a method of manufacturing a semiconductor device according to a fourth embodiment of the present invention.

With reference to FIGS. 5A and 5B, the method of manufacturing a semiconductor device according to the fourth embodiment will now be described. Components of a cleaning fluid used in the fourth embodiment are identical with those described in connection with the first embodiment. Hence, repetition of their explanations is omitted here.

With reference to FIG. 5A, an interlayer insulating film serving as an insulating film 84 composed of a silicon oxide film, for example, is formed on the semiconductor substrate 1 by CVD method. Next, a contact hole 94 is formed by dry etching so as to extend from the surface of the insulating film 84 to the semiconductor substrate 1, with un-illustrated resist pattern as a mask.

Next, a barrier metal layer 22 composed of titanium nitride or tungsten nitride, for example, is formed on the surface of the insulating film 84 and the internal surface (both sides) of the contact hole 94, by PVD method.

Subsequently, tungsten 32 is embedded in the contact hole 94 by CVD method. or PVD method.

Next, unnecessary portions of the tungsten 32 are removed by CMP (hereinafter called "a first CMP steps").

Next, as shown in FIG. 5B, the barrier metal layer 22 on the surface of the insulating film 84 is removed by CMP (hereinafter called "a second CMP step"). Thus, a tungsten plug serving as an interconnection pattern 42 is formed.

Finally. the semiconductor substrate 1 is cleaned in the cleaning step, more specifically, in which the semiconductor substrate 1 is cleaned by use of a cleaning fluid containing a hydroxide, a silicon corrosion inhibitor, and an organic compound serving as a tungsten corrosion inhibitor.

As described above, in the method of manufacturing a semiconductor device according to the fourth embodiment of the present invention, the semiconductor substrate 1 is cleaned in the cleaning step subsequent to formation of a tungsten plug serving as an interconnection pattern 42. Here, in the cleaning step, the cleaning fluid containing the hydroxide, the silicon corrosion inhibitor, and the organic compound is used.

According to this method, adding the organic compound to the cleaning fluid prevents corrosion of the surface of the tungsten plug 32 serving as a tungsten-based member smoothed through two CMP steps which would otherwise be caused by the hydroxide contained in the cleaning fluid. Accordingly, there is prevented occurrence of a step which would otherwise arise in the surface of the tungsten plug 32, during the cleaning step.

In addition to the foregoing advantages, adding the silicon corrosion inhibitor to the cleaning fluid, can prevents corrosion of the insulating film 84 which is served as a silicon-based.

Thus, there can be prevented occurrence of a step in the surface of the tungsten film 32 and the surface of the insulating film 84 during a cleaning step.

Even when a silicon corrosion inhibitor is added to the cleaning fluid at high concentration, the cleaning capability of the cleaning fluid is improved by addition of the water-soluble organic solvent to the cleaning fluid. Accordingly, a high cleaning capability, a high silicon corrosion prevention effect, and a high tungsten corrosion prevention effect can be attained simultaneously in the cleaning step.

The cleaning step may be performed not after completion of the second CMP process but during an interval between the first and second CMP processes.

Unnecessary portions of the tungsten film 32 or unnecessary portions of the barrier metal film 22 may be removed by dry etching.

Fifth Embodiment

Figure 6A:
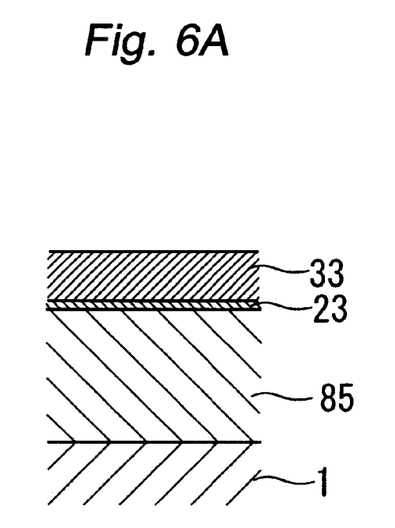
FIGS. 6A and 6B are cross-sectional views for describing a method of manufacturing a semiconductor device, according to a fifth embodiment of the present invention.
Figure 6B:
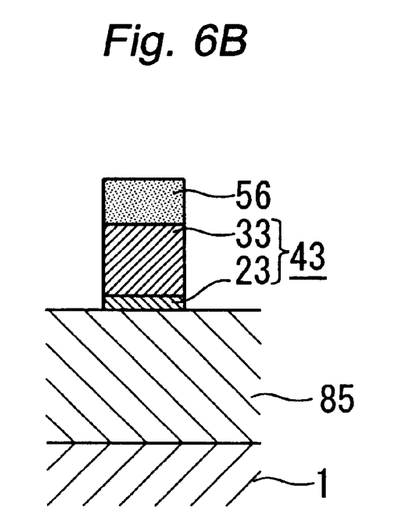

FIGS. 6A and 6B are cross-sectional views for describing a method of manufacturing a semiconductor device according to a fifth embodiment of the present invention.

With reference to FIGS. 6A and 6B, a method of manufacturing a semiconductor device according to the fifth embodiment will now be described. Components of a cleaning fluid employed in the fifth embodiment are identical with those described in connection with the first embodiment. Hence, repetition of their explanations is omitted here.

With reference to FIG. 6A. an interlayer insulating film serving as an insulating film 85 composed of a silicon oxide film, for example, is formed on the semiconductor substrate 1 by CVD method. Next, a barrier metal layer 23 composed of titanium nitride, for example, and a tungsten film 33 are formed on the interlayer insulating film 85 by CVD method or PVD method, in this sequence.

Next, with reference to FIG. 6B, a resist pattern 56 is formed on the tungsten film 33. Subsequently, a tungsten wire serving as an interconnection pattern 43 is formed by dry etching, with the resist pattern 56 as a mask.

Next, although not shown, the resist pattern 56 is removed by plasma ashing, thereafter resist residues are remained on the top and both sides of the interconnection pattern 43.

Finally, although not shown, the semiconductor substrate 1 is cleaned in a cleaning step, more specifically, in which the semiconductor substrate 1 is cleaned by use of a cleaning fluid containing a hydroxide, a silicon corrosion inhibitor, and an organic compound. Thus, the resist residues and the particles are removed from the semiconductor substrate 1.

As described above, in the method of manufacturing a semiconductor device according to the fifth embodiment of the present invention, the semiconductor substrate 1 is cleaned in the cleaning step subsequent to formation of the tungsten wire serving as the interconnection pattern 42. In the cleaning step, the cleaning fluid containing the hydroxide and the organic compound is used.

According to this method, use of the cleaning fluid, in which the organic compound is contained, can prevent corrosion of the tungsten film 33.

There can be diminished variations in the dimension of the interconnection pattern 43 (tungsten wire), which occur during the course of cleaning of a semiconductor substrate.

In addition to the foregoing advantages, corrosion of the interlayer insulating film 85 serving as a silicon-based member can be prevented by further addition of a silicon corrosion inhibitor to the cleaning fluid.

Therefore, even when an solution containing a hydroxide which is highly likely to dissolve a silicon-based member is used as the cleaning fluid in the cleaning step or when a silicon-based member (e.g., the interlayer insulating film 85) which is highly likely to be dissolved into an aqueous hydroxide is cleaned in the cleaning step, corrosion of a silicon-based member can be prevented.

Accordingly, a high silicon corrosion prevention effect and a high tungsten corrosion prevention effect can be attained simultaneously in the cleaning step.

Further, even when the silicon corrosion inhibitor is added to the cleaning fluid at high concentration, the water-soluble organic solvent, which is added to the cleaning fluid, enables an increase in the concentration of hydroxide in the cleaning fluid. Accordingly, a high cleaning capability, a high silicon corrosion prevention effect, and a high tungsten corrosion prevention effect can be attained simultaneously in the cleaning step.

Further, high cleaning capability can be attained in a cleaning step by addition of only a water-soluble organic solvent to a cleaning fluid containing a hydroxide and an organic compound.

In the fifth embodiment, a photoresist pattern is used as a mask. However, an insulating film composed of a silicon oxide film or a silicon nitride film, for example, may be taken as a mask. Even in such a case, the previously-described cleaning fluid can be used in a cleaning step subsequent to dry etching step. Further, a cleaning capability in the case is same as that in the case where a photoresist pattern is used as a mask.

This invention, when practiced illustratively in the manner described above, provides the following major effects:

According to a first aspect of the present invention, a high cleaning capability and a high silicon corrosion prevention effect can be attained simultaneously in the cleaning step.

In a preferred variation of the first aspect of the present invention, since at least one organic compound, which is selected from the group of the an organic compound having at least one mercapto group, an organic compound having at least two hydroxyl groups, and an organic compound having at least one hydroxyl group and at least one carboxyl group, is further added to the cleaning fluid, a high cleaning capability, a high silicon corrosion prevention effect, and a high tungsten corrosion prevention effect can be attained simultaneously in the cleaning step.

According to a second aspect of the present invention, a high tungsten corrosion prevention effect can be attained in the cleaning step.

In a preferred variation of the second aspect of the present invention, since a compound expressed by the previously-described formula (I) or (II) is further added to the cleaning fluid, a high silicon corrosion prevention effect and a high tungsten corrosion prevention effect can be attained simultaneously in the cleaning step.

In a preferred variation of the second aspect of the present invention, since a water-soluble organic solvent is further added to the cleaning fluid, a high cleaning capability and a high tungsten corrosion prevention effect can be attained simultaneously in the cleaning step.

Further, the present invention is not limited to these embodiments, but variations and modifications may be made without departing from the scope of the present invention.

The entire disclosure of Japanese Patent Application No. 2000-197553 filed on Jun. 30, 2000 containing specification, claims, drawings and summary are incorporated herein by reference in its entirety.

What is claimed is:

1. a method of manufacturing a semiconductor device comprising a cleaning step of cleaning a semiconductor substrate by use of a cleaning fluid containing:

a hydroxide;

a water-soluble organic solvent; and a compound expressed by the following chemical formula (I) or (II):

wherein "EO" designates an oxyethyethylene group; "PO" designates an oxypropylene group; "R" designates a residue formed by eliminating hydrogen atoms from a hydroxyl group of alcohol or amine, or a residue formed by eliminating hydrogen atoms from an amino acid; "x" and "y" are integers satisfying x/(x+y)=0.05 to 0.4; and "z" and "m" are positive integers.

2. The method of manufacturing a semiconductor device according to claim 1, wherein said cleaning fluid used in said cleaning step further containing:
   at least one organic compound selected from the group of an organic compound having at least one mercapto group, an organic compound having at least two hydroxyl groups, and an organic compound having at least one hydroxyl group and at least one carboxyl group.

3. A method of manufacturing a semiconductor device comprising a cleaning step of cleaning a semiconductor substrate by use of a cleaning fluid containing
   hydroxide; and
   at least one organic compound selected from the group of an organic compound having at least one mercapto group, an organic compound having at least two hydroxyl groups, and an organic compound having at least one hydroxyl group and at least one carboxyl group.

4. The method of manufacturing a semiconductor device according to claim 1, wherein in said cleaning step, while said semiconductor substrate is cleaned, tungsten-based members and silicon-based members are exposed on said semiconductor substrate simultaneously.

5. The method of manufacturing a semiconductor device according to claim 4, wherein in said cleaning step, while said semiconductor substrate is cleaned, said tungsten-based members and at least two types of said silicon-based members are exposed on said semiconductor substrate simultaneously.

6. The method of manufacturing a semiconductor device according to claim 1, further comprising the steps of:
   forming an insulating film, a polysilicon film, a barrier metal layer, and a tungsten film, in this sequence, on said semiconductor substrate;
   forming a first resist pattern on said tungsten film;
   forming an interconnection pattern by dry etching said polysilicon film, said barrier metal layer, and said the tungsten film with said first resist pattern as a mask; and
   removing said first resist pattern;
   wherein the above steps are carried out prior to said cleaning step.

7. The method of manufacturing a semiconductor device according to claim 6, further comprising the steps of:
   forming a second resist pattern on said interconnection pattern and on said insulating film around said interconnection pattern;
   implanting ions into said semiconductor substrate with said second resist pattern as a mask; and
   removing said second resist pattern;
   wherein the above steps are carried out prior to said cleaning step.

8. The method of manufacturing a semiconductor device according to claim 2, further comprising the steps of:
   forming a first insulating film on said semiconductor substrate;
   forming an interconnection pattern, which is formed by stacking a polysilicon film, a barrier metal layer, and a tungsten film, in this sequence, on said first insulating film;
   forming a second insulating film on said interconnection pattern;
   forming a first resist pattern on said second insulating film;
   forming a contact hole by dry etching with said first resist pattern as a mask, so as to extend from the surface of said second insulating film to the interconnection pattern; and
   removing said first resist pattern;
   wherein the above steps are carried out prior to said cleaning step.

9. The method of manufacturing a semiconductor device according to claim 3, further comprising the steps of:
   forming an insulating film on said semiconductor substrate;
   forming a contact hole so as to extend from the surface of said insulating film to said semiconductor substrate;
   forming a barrier metal layer on the surface of said insulating film and on the internal surface of said contact hole;
   embedding a tungsten in said contact hole:
   removing unnecessary portions of said tungsten by CMP; and
   removing said barrier metal layer on said surface of said insulating film by CMP;
   wherein the above steps are carried out prior to said cleaning step.

10. The method of manufacturing a semiconductor device according to claim 2, further comprising the steps of:
    forming a first insulating film on said semiconductor substrate;
    forming an interconnection pattern, which is formed by stacking a polysilicon film, a barrier metal layer, and a tungsten film, in this sequence, on said first insulating film;
    forming a second insulating film on said interconnection pattern and on said first insulating film around said interconnection pattern;
    forming a resist pattern on said second insulating film;
    forming a first contact hole so as to extend from the surface of said second insulating film to the top of said interconnection pattern and forming a second contact hole so as to extend from said surface of said second insulating film to said first insulating film, with said resist pattern as a mask; and
    removing said resist pattern;
    wherein the above steps are carried out prior to said cleaning step.

11. The method of manufacturing a semiconductor device according to claim 2, further comprising the steps of:
    forming a first insulating film on said semiconductor substrate;
    forming an interconnection pattern, which is formed by stacking a polysilicon film, a barrier metal layer, and a tungsten film, in this sequence, on said first insulating film;
    forming a second insulating film on said interconnection pattern and on said first insulating film around said interconnection pattern;
    forming a third insulating film on said second insulating film;
    forming a resist pattern on said third insulating film;
    forming a contact hole so as to extend from the surface of said third insulating film to the top of said interconnection pattern, with said resist pattern as a mask; and removing said resist pattern;

wherein the above steps are carried out prior to said cleaning step.

12. The method of manufacturing a semiconductor device according to claim 1, wherein said hydroxide contained in said cleaning fluid is at least one member selected from the group of ammonium hydroxide, TMAH (tetramethylammonium hydroxide), sodium hydroxide, and potassium hydroxide.

13. The method of manufacturing a semiconductor device according to claim 1, wherein a concentration of said hydroxide in said cleaning fluid is 0.01 wt. % to 31 wt. %.

14. The method of manufacturing a semiconductor device according to claim 1, wherein said water-soluble organic solvent contained in said cleaning fluid is at least one member selected from the group of alcohols, ketones, esters, and phenols.

15. The method of manufacturing a semiconductor device according to claim 1, wherein a mean molecular weight of said oxypropylene group of said compound, which is expressed by said chemical formula (I) or (II) in said cleaning fluid, is 500 to 5000.

16. The method of manufacturing a semiconductor device according to claim 1, wherein said hydroxide and said compound expressed by said chemical formula (I) or (II) are mixed into said cleaning fluid in proportions by weight of about $1:(0.3 \times 10^{-4}$ to 1).

17. The method of manufacturing a semiconductor device according to claim 1, wherein a concentration of said water-soluble organic solvent in said cleaning fluid is 0.01 wt. % to 50 wt. %.

18. The method of manufacturing a semiconductor device according to claim 2, wherein a concentration of said organic compound in said cleaning fluid is 0.0001 wt. % to 5 wt. %.

19. The method of manufacturing a semiconductor device according to claim 1, wherein a temperature of said cleaning fluid is 20° to 80° C.

* * * * *

UNITED STATES PATENT AND TRADEMARK OFFICE
CERTIFICATE OF CORRECTION

PATENT NO.   : 6,482,750 B2
DATED        : November 19, 2002
INVENTOR(S)  : Naoki Yokoi It is certified that error appears in the above-identified patent and that said Letters Patent is hereby corrected as shown below:

Title page,
Item [73], Assignee, after the word Kabushiki change "Kaishi" to -- Kaisha --

Signed and Sealed this

Twenty-first Day of September, 2004

JON W. DUDAS
*Director of the United States Patent and Trademark Office*